United States Patent [19]

Raetzel et al.

[11] 4,017,769
[45] Apr. 12, 1977

[54] INTEGRATED CIRCUITS AND METHOD OF PRODUCING THE SAME

[75] Inventors: Charlotte Raetzel, Munich; Jenoë Tihanyi, Neuried, both of Germany

[73] Assignee: Siemens Aktiengesellschaft, Berlin & Munich, Germany

[22] Filed: Feb. 16, 1973

[21] Appl. No.: 333,334

[30] Foreign Application Priority Data

Feb. 17, 1972 Germany .................... 2207510

[52] U.S. Cl. ................................ 361/419; 357/59; 361/411
[51] Int. Cl.² ........................................ H05K 5/00
[58] Field of Search ... 317/101 A, 101 CC, 235 AS; 357/49, 59, 40

[56] References Cited

UNITED STATES PATENTS

| 3,413,145 | 11/1968 | Robinson et al. | 317/235 AS |
| 3,736,193 | 5/1973 | Tucker et al. | 317/235 AS |

Primary Examiner—David Smith, Jr.
Attorney, Agent, or Firm—Hill, Gross, Simpson, Van Santen, Steadman, Chiara & Simpson

[57] ABSTRACT

An integrated circuit formed on the surface of an insulating substrate is provided with an overlying conductive layer interconnecting the integrated circuit with an external electrode, and an intermediate layer of insulating material is interposed between the conductive layer and the substrate.

15 Claims, 1 Drawing Figure

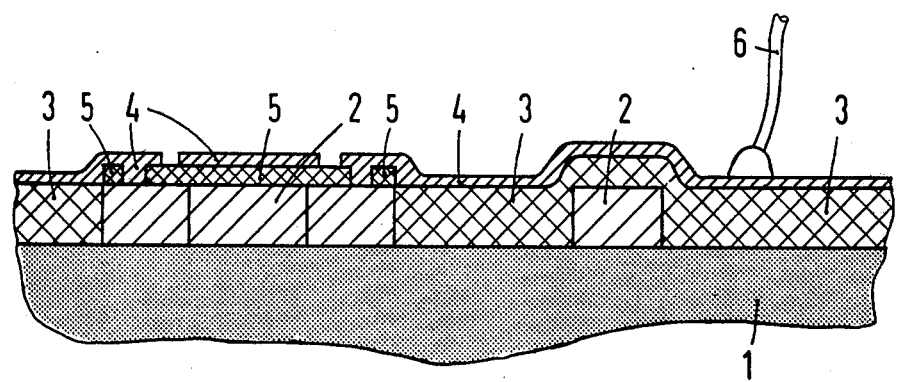

INTEGRATED CIRCUITS AND METHOD OF PRODUCING THE SAME

BACKGROUND OF THE INVENTION

1. Field of the Invention

The present invention relates to integrated circuits and more particularly to integrated circuits formed on the surface of an electrically insulating substrate.

2. The Prior Art

It is not uncommon for integrated circuits to be formed on the surface of an insulating substrate, and the integrated circuit is electrically connected to external terminals by means of conductor paths which overly the substrate. The conductor paths typically consist of aluminum, but certain parts may be formed of highly doped semi-conductor material.

One disadvantage of such an arrangement is that mechanical stressing of the conductor paths which are applied directly to the insulating substrate sometimes lead to the aluminum becoming detached from the substrate. When the connection between the conductor path and an external terminal is made by ultrasonic means, for example, the resulting mechanical stresses can cause the conductor paths to separate from the substrate. It is therefore, desirable to provide a means for increasing the mechanical integrity of the conductor paths.

SUMMARY OF THE INVENTION

It is a principal object of the present invention to provide a structure for an integrated circuit which achieves greater mechanical integrity of the conductor paths by which the integrated circuit is connected to an external terminal.

Another object of the present invention is to provide a method of forming such an integrated circuit structure.

A further object of the present invention is to provide such a method which is compatible with conventional manufacturing techniques for integrated circuits.

Another object is to provide a structure for an integrated circuit in which the level of the conductor paths, by which the integrated circuit is connected to an external terminal, does not differ greatly from the level of semiconductor layers of the integrated circuit.

These and other objects and advantages of the present invention will become manifest upon an examination of the following description and the accompanying drawing.

In one embodiment of the present invention there is provided an integrated circuit comprising a plurality of separated islands of semiconductive material supported on an electrically insulating substrate, a metallic conductor path supported on the substrate, an external electrode connected with the conductor path, and an intermediate electrically insulating layer disposed between the conductive path and the substrate at the location where the external electrode contacts the conductor path.

BRIEF DESCRIPTION OF THE DRAWING

The drawing illustrates, in cross-sectional form, an integrated circuit incorporating an illustrative embodiment of the present invention.

DESCRIPTION OF THE PREFERRED EMBODIMENT

Referring to the drawing, an electrically insulating substrate 1, preferably consisting of a spine or sapphire, has applied thereto a semiconductor layer 2, preferably formed of monocrystalline silicon, which is separated into a plurality of islands on the surface of the substrate 1. An electrically insulating intermediate layer 3 is applied to the exposed areas of the substrate 1 and to some of the exposed areas of the semiconductor material 2, and covers the substrate 1 between the islands of the layer 2. The insulating intermediate layer 3 is preferably formed of $SiO_2$ or $Si_3N_4$.

Metallic conductor paths 4, preferably consisting of aluminum, serve to contact the semiconductor material at places not covered by the layer 3, and overlie the surface of the intermediate layer 3. In fabricating field effect transistors openings must be left, where desired, in the layer 3, for the gate areas. After forming the gate oxide 5, and the openings in the gate oxide as seen in cross section as shown in the drawing, the conductor path 4 establishes electrical contact with the outer surface of the semiconductor material 2.

A terminal electrode 6 is in electrical contact with the conductor path 4. The electrode 6 is preferably an aluminum wire and is preferably connected to the conductor path 4 by means of ultrasonic contacting or by some other conventional means.

The substrate 1 is preferably a monocrystaline spinel or sapphire wafer which is mechanically polished and subsequently chemically etched. The semiconducting layer 2, which is preferably formed of silicon, is deposited on the substrate in any known manner, and is approximately one micron in thickness. Using known photolithograph techniques, semiconducting zones are produced in the silicon layer 2, for example by diffusion, and by a subsequent etching process, various zones of the semiconducting material 2 are separated from one another so that they form islands on the substrate 1. Again using photolithographic techniques, the intermediate layer 3 is applied to the exposed surface of the substrate 1 and to portions of the exposed surface of the semiconducting layer 2. The conductor paths 4 are thereafter applied, again preferably using known photolithographic techniques, in order to establish electrical contact between various points of the semiconducting layer and the aluminum conductor paths 4. Preferably, the conductor paths 4 are applied by vapor deposition.

When the intermediate insulating layer 3 is to be formed of $SiO_2$, preferably the layer is formed by mixing $SiH_4$ or tetraethoxysilane with oxygen, and permitting the mixture to react chemically at a temperature in the range of approximately 300–400° C. When the intermediate layer is to be formed of $Si_3N_4$, a mixture of $SiH_4$ and $NH_3$ is permitted to react at a temperature in the range of approximately 600–700° C. When the intermediate layer is produced at a relatively low temperature, the layer may be compressed at a temperature above 700° C in order to insure that it is free from pores.

When the present invention is employed to produce an integrated circuit incorporating a field effect transistors, the gate insulator may be formed at the same time as the compression of the low temperature insulating layer. In this event, the low temperature insulating layer is removed from the gate region photolithographically, after which the gate insulator is subsequently produced, formed of $SiO_2$ or a combination of $SiO_2$ and $Si_3N_4$. The gate conductor is then formed by depositing a conductor path 4.

The present invention results in producing conductor paths 4 which adhere firmly to the body of the integrated circuit, for aluminum adheres very well to $SiO_2$ and $Si_3N_4$, and layers $SiO_2$ and $Si_3N_4$ adhere very well to many insulating substrates, particularly substrates of spinel and sapphire. In this way a much more rigid assembly is produced than if the connector 4 were applied directly to the insulator substrate. The process of the present invention is completely compatible with conventionally used processes for the manufacture of integrated circuits. Moreover, due to the approximately same thickness of the layer 3 and 2, the level of the semiconductor layer 2 and the level of the conductor paths 4 do not differ greatly.

What is claimed is:

1. An integrated circuit comprising an electrically insulating substrate formed of sapphire or spinel, a plurality of individual areas of a semiconductor layer supported on said substrate, a metallic conductor path supported on said substrate for connecting an external electrode with at least a portion of said semiconductor layer, and an electrically insulating intermediate layer interposed between said substrate and said conductive path and underlying all of the junction between said external electrode and said conductive path, said intermediate layer being disposed immediately on said substrate under said junction and immediately under said conductive path, and formed of $SiO_2$ or $Si_3N_4$.

2. Apparatus according to claim 1, wherein said intermediate insulating layer overlies at least a portion of one of said individual semiconductor areas.

3. Apparatus according to claim 2, wherein said intermediate insulating layer is interposed between said portion of the individual semiconductor area and said conductive path.

4. An integrated circuit as claimed in claim 1, wherein said semiconductor layer is formed of silicon.

5. An integrated circuit as claimed in claim 1, wherein said metallic conductor path is formed of aluminium.

6. A method of producing an integrated circuit, comprising the steps of forming a semiconductor layer on a portion of the surface of an electrically insulating substrate, applying an electrically insulating layer of $SiO_2$ or $Si_3N_4$ to a portion of said surface and to a portion of the surface of said semiconductor layer, and thereafter applying a conductor path to the surface of said insulating layer where it lies immediately over said substrate for connecting said semiconductor layer to an external electrode.

7. The method as claimed in claim 6, wherein said intermediate layer is formed of $SiO_2$ and is produced by chemically reacting $SiH_4$ with oxygen at a temperature in the range of 300° – 400° C.

8. The method as claimed in claim 6, wherein said intermediate layer is formed of $SiO_2$ and is produced by chemically reacting tetraethoxysilane with oxygen at a temperature in the range of 350° – 450° C.

9. The method as claimed in claim 6, wherein said intermediate layer is formed of $Si_3N_4$ and is produced by chemically reacting $SiH_4$ and $NH_3$ at a temperature in the range of 600° – 700° C.

10. The method as claimed in claim 6, including the step of compressing said intermediate layer at a temperature above 700° C.

11. The method as claimed in claim 10 wherein said the compression of the intermediate layer is connected with the fabrication of the gate-isolator of a field effect transistor consisting of the semiconductor layer and wherein said intermediate layer must be removed from the gate of said field effect transistor.

12. The method according to claim 6, including the step of connecting an electrode to said conductor path at an area where said insulating layer lies immediately between said substrate and said conductor path.

13. In an integrated circuit having an electrically insulating substrate formed of sapphire or spinel, a plurality of individual areas of a semiconductor layer supported on said substrate, and a metallic conductor path supported on said substrate, means for firmly supporting said conductor path by said substrate, comprising an electrically insulating intermediate layer interposed between said substrate and said conductive path and underlying all of the junction between said external electrode and said conductive path, said intermediate layer being disposed immediately on said substrate under said junction and immediately under said conductive path, and formed of $SiO_2$ or $Si_3N_4$.

14. A method of producing an integrated circuit having a substrate formed of sapphire or spinel with a conductor path firmly supported by said substrate, comprising the steps of forming a semiconductor layer on a portion of a surface of said substrate, applying an electrically insulating layer of $SiO_2$ or $SiN_4$ to a portion of said surface and to a portion of the surface of said semiconductor layer, and thereafter applying a conductor path to the surface of said insulating layer where it lies immediately over said substrate for connecting said semiconductor layer to an external electrode.

15. The method according to claim 14, including the step of connecting an electrode to said conductor path at an area where said insulating layer lies immediately between said substrate and said conductor path.

* * * * *